(12) United States Patent
Sharpe-Geisler et al.

(10) Patent No.: US 8,451,679 B1
(45) Date of Patent: May 28, 2013

(54) DUAL-PORT SRAM WITH BIT LINE CLAMPING

(75) Inventors: Brad Sharpe-Geisler, San Jose, CA (US); Timothy Scott Swensen, Santa Clara, CA (US); Sam Tsai, Milpitas, CA (US); Fabiano Fontana, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 168 days.

(21) Appl. No.: 13/212,121

(22) Filed: Aug. 17, 2011

(51) Int. Cl.
*G11C 7/00* (2006.01)

(52) U.S. Cl.
USPC ............ 365/230.05; 365/189.06; 365/189.14; 365/18.16

(58) Field of Classification Search
USPC .............. 365/230.05, 189.06, 189.14, 189.16
See application file for complete search history.

(56) References Cited

U.S. PATENT DOCUMENTS

| | | | |
|---|---|---|---|
| 5,777,942 A * | 7/1998 | Dosaka et al. | 365/230.03 |
| 7,206,251 B1 | 4/2007 | Yu | |
| 7,471,588 B2 * | 12/2008 | Yu et al. | 365/230.05 |
| RE41,325 E | 5/2010 | Yu et al. | |
| 7,797,610 B1 | 9/2010 | Simkins | |

* cited by examiner

*Primary Examiner* — Son Dinh
(74) *Attorney, Agent, or Firm* — Haynes and Boone, LLP (57) ABSTRACT

In one embodiment, a memory is provided that includes: a write driver for selectively driving a driven pair of bit lines selected from a plurality of bit line pairs during a write operation; a first stage clamping circuit operable to clamp a pair of internal nodes to a clamping voltage, wherein the first stage clamping circuit is further operable to unclamp the pair of internal nodes during the write operation; a bit line multiplexer for selectively coupling the driven bit line pair to the pair of internal nodes; and a second stage clamping circuit operable to clamp the plurality of bit line pairs to the clamping voltage, wherein the second stage clamping circuit is further operable to unclamp the driven bit line pair during the write operation.

20 Claims, 6 Drawing Sheets

DUAL-PORT SRAM WITH BIT LINE CLAMPING

TECHNICAL FIELD

The present invention relates generally to memories, and more particularly to a dual-port static random access memory (SRAM) with bit line clamping.

BACKGROUND

Figure 1:
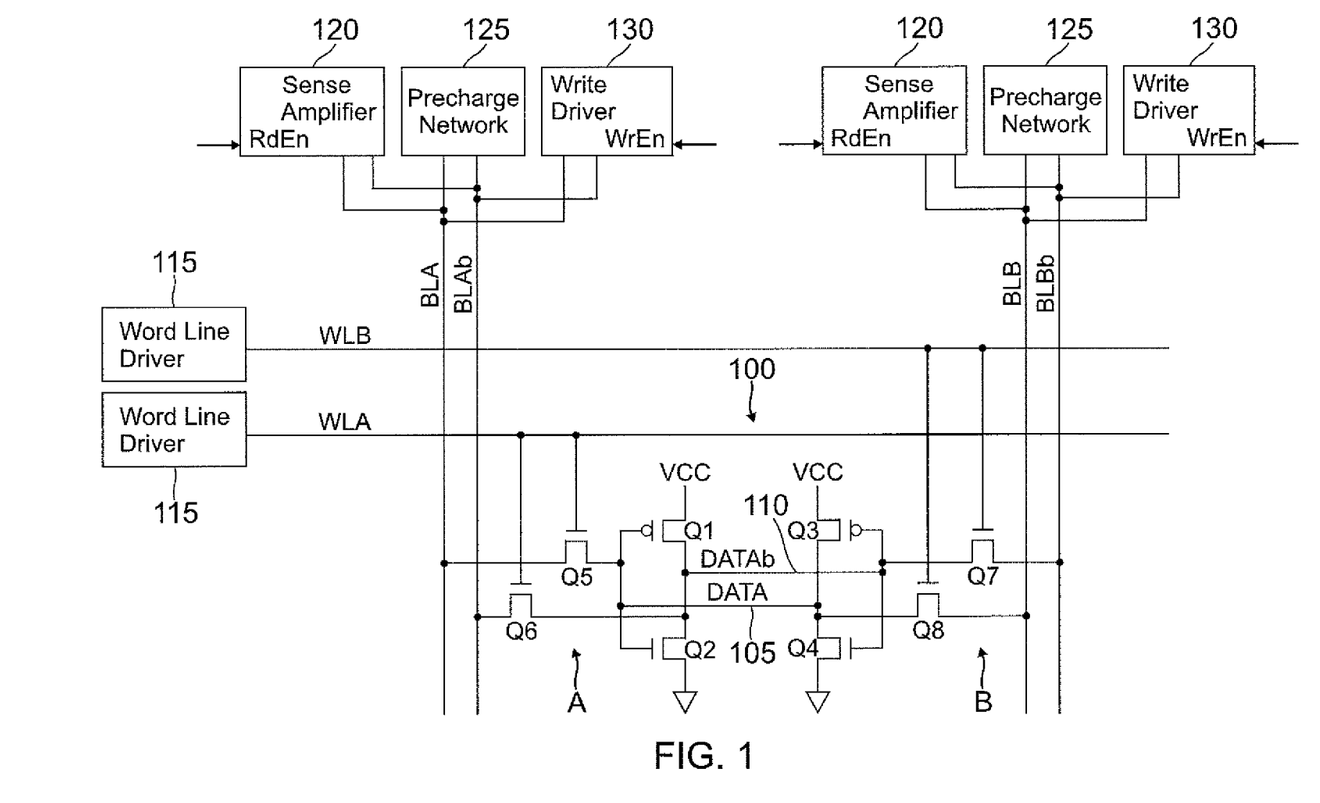
FIG. 1 is a schematic illustration of a conventional dual-port SRAM.

Static random access memory (SRAM) conventionally uses a six-transistor (6-T) memory cell that includes cross-coupled inverters that drive a bit node and bit complement node. To provide a second access port, two additional transistors are added to the 6-T memory cell to form an 8-T dual-port SRAM cell. FIG. 1 shows the resulting 8-T dual-port SRAM cell 100. Transistors Q1, Q2, Q3, and Q4 form cross-coupled inverters that drive a DATA node 105 and a DATA complement (DATAb) node 110. A first read/write access port A to nodes 105 and 110 is formed by access transistors Q5 and Q6 as driven by a word line A (WLA). Similarly, a second read/write access port B to nodes 105 and 110 is formed by access transistors Q7 and Q8 as driven by a word line B (WLB). Each word line is asserted during a read or write operation by a corresponding word line driver 115.

When word line WLA is asserted, access transistor Q5 turns on to couple a true bit line A (BLA) to DATA node 105. Similarly, with WLA being asserted, access transistor Q6 turns on to couple a complement bit line A (BLAb) to complement data node DATAb 110. Conversely, assertion of word line B (WLB) turns on access transistors Q7 and Q8 to couple a true bit line B (BLB) to node 105 and to couple a complement bit line B (BLBb) to complement data node 110. As known in the SRAM arts, each bit line pair is sensed by a corresponding sense amplifier 120 during read operations as driven by a read enable signal (RdEn). When neither a read nor a write operation is active, the bit line pairs are pre-charged by a corresponding precharge network 125. In a write operation, the bit line pairs are driven by a corresponding write driver 130 as enabled by a write enable signal (WrEn).

Read and write operations on the dual access ports may be performed asynchronously. While it is considered illegal to attempt to write to cell 100 through both ports simultaneously, it is allowed that one port may write to the cell while the remaining port is reading from the cell. In such circumstances, the read operation may return an indeterminate value. However, it is desirable that a write operation at one access port succeed consistently despite the existence of concurrent read operation at the remaining access port. Thus, a write operation on one access port should succeed in spite of a wide variety of possible states for the remaining access port, which ranges from an un-accessed state to a fully-developed read access state. In that regard, the fully-developed read access state may be of the opposite polarity with regard to the bit being driven by the write operation.

This opposite polarity of a read operation on one port may affect the write operation on the remaining port. For example, if data node 105 is storing a logical high state (DATA=1) whereas complement data node 110 is storing a logical low state (DATAb=0), the stored data states will oppose a write operation occurring at access port B that is attempting to "flip" the memory cell—in other words, a write operation that attempts to bring data node 105 low and complement data node 110 high. In such a scenario, word line A (WLA) will be asserted in conjunction with the read operation at port A after the release of the pre-charge on bit lines BLA and BLAb. Bit line BLAb will then be pulled low through transistor Q2. If one neglects the effect of sense amplifier 120, bit line BLA will be held at the supply voltage VCC minus the threshold voltage for Q5. However, many sense amplifiers utilize positive feedback that will assist in pulling bit line BLAb low and bit BLA high more quickly than just through the discharge through transistor Q2.

To begin the write operation at port B, word line B (WLB) goes high after the release of the pre-charge on bit lines BLB and BLBb. Write driver 130 will then pull bit line BLB low while maintaining complement bit line BLBb high. Bit line BLB low in turn pulls DATA node 105 low through transistor Q8. The threshold voltage drop $V_t$ across transistor Q7 prevents high bit line BLBb from charging DATAb node 110 fully high. DATAb node 110 is instead charged high when low DATA node 105 turns on transistor Q1. Conversely, as DATAb node 110 goes high, transistor Q4 is turned on, which pulls DATA node 105 fully to ground. The minimum time necessary to complete the write operation at port B is affected by the read operation that has yet to be completed at port A. In that regard, transistor Q1 must pull DATAb node 110 and bit line BLAb (through transistor Q6) sufficiently high to prevent the read operation from writing the old bit back into node DATAb 110 once the write operation at port B ceases. Transistors Q1 and Q6 are relatively weak with regard to the heavily-loaded bit line BLAb so that charging bit line BLAb in this fashion requires some time. The write operation time must thus, be increased to ensure that opposing read operations are countered in this fashion.

Several approaches have been developed to address the conflict between simultaneous read and write operations in dual-port memories. For example, one approach uses logic to ensure that write operations have priority over reads. The logic monitors whether write operations exist on any given row in the memory. If a write operation is detected at one port for a dual-port memory cell, the logic prevents any read operations on the opposing port by pulling the corresponding word line low. In this fashion, the read bit lines are isolated from the memory cell, which reduces the amount of time necessary to complete the write operation on the opposing port since none of the isolated read bit lines need to be charged in conjunction with the operation charging the memory cell node. But such a logic approach suffers from the requirement of adding the necessary logic itself and its associated routing. Moreover, the approach suffers from disturbing a read operation whenever a simultaneous write operation occurs.

In another technique, the SRAM cell itself is redesigned with more robust cell transistors and write-driver circuitry. But such an approach increases die cost due to the necessary die area that must be allotted to the larger transistors. In addition, the larger cell transistors increase capacitance and thus load the bit-lines undesirably.

Accordingly, there is a need in the art for improved dual-port memories that offer faster write operations with regard to opposing read operations.

SUMMARY

In accordance with a first embodiment, a memory is provided that includes: a write driver for selectively driving a driven pair of bit lines selected from a plurality of bit line pairs during a write operation; a first stage clamping circuit operable to clamp a pair of internal nodes to a clamping voltage, wherein the first stage clamping circuit is further operable to unclamp the pair of internal nodes during the write operation; a bit line multiplexer for selectively coupling the driven bit line pair to the pair of internal nodes; and a second stage clamping circuit operable to clamp the plurality of bit line pairs to the clamping voltage, wherein the second stage clamping circuit is further operable to unclamp the driven bit line pair during the write operation.

In accordance with a second embodiment, a method of clamping a dual-port memory having a plurality of bit line pairs is provided that includes: clamping a pair of internal nodes to a clamping voltage; clamping the plurality of bit line pairs to the clamping voltage; during a write operation, unclamping the pair of internal nodes from the clamping voltage and unclamping a selected pair of bit lines from the plurality of bit line pairs; coupling the selected pair of bit lines to the pair of internal nodes; and driving the selected pair of bit lines with a write driver during the write operation.

In accordance with a third embodiment, a dual-port memory is provided that includes: a plurality of bit line pairs; a multiplexer for coupling a driven one of the bit line pairs to a pair of internal nodes; bit line clamping circuitry operable to clamp the bit line pairs and the pair of internal nodes to a clamping voltage, wherein the bit line clamping circuitry is further operable to unclamp the driven bit line pair and the pair of internal nodes during a write operation for a dual-port memory cell; and a write driver for driving the driven bit line pair during the write operation.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

To address the conflict between contemporaneous read and write operations on opposing ports of a dual-port memory cell, bit line clamping circuitry is provided that is active in the absence of a write operation. In this fashion, a read operation that would ordinarily result in the discharge of a bit line will now discharge that bit line to a clamped voltage established by the clamping circuitry. During write operations, the clamping circuitry is de-activated to release the bit line clamping. The resulting write operation will no longer have to fight any bit line discharging resulting from an opposing read operation. Thus, the write operation completion time is significantly shortened, which results in faster memory operation.

Figure 2:
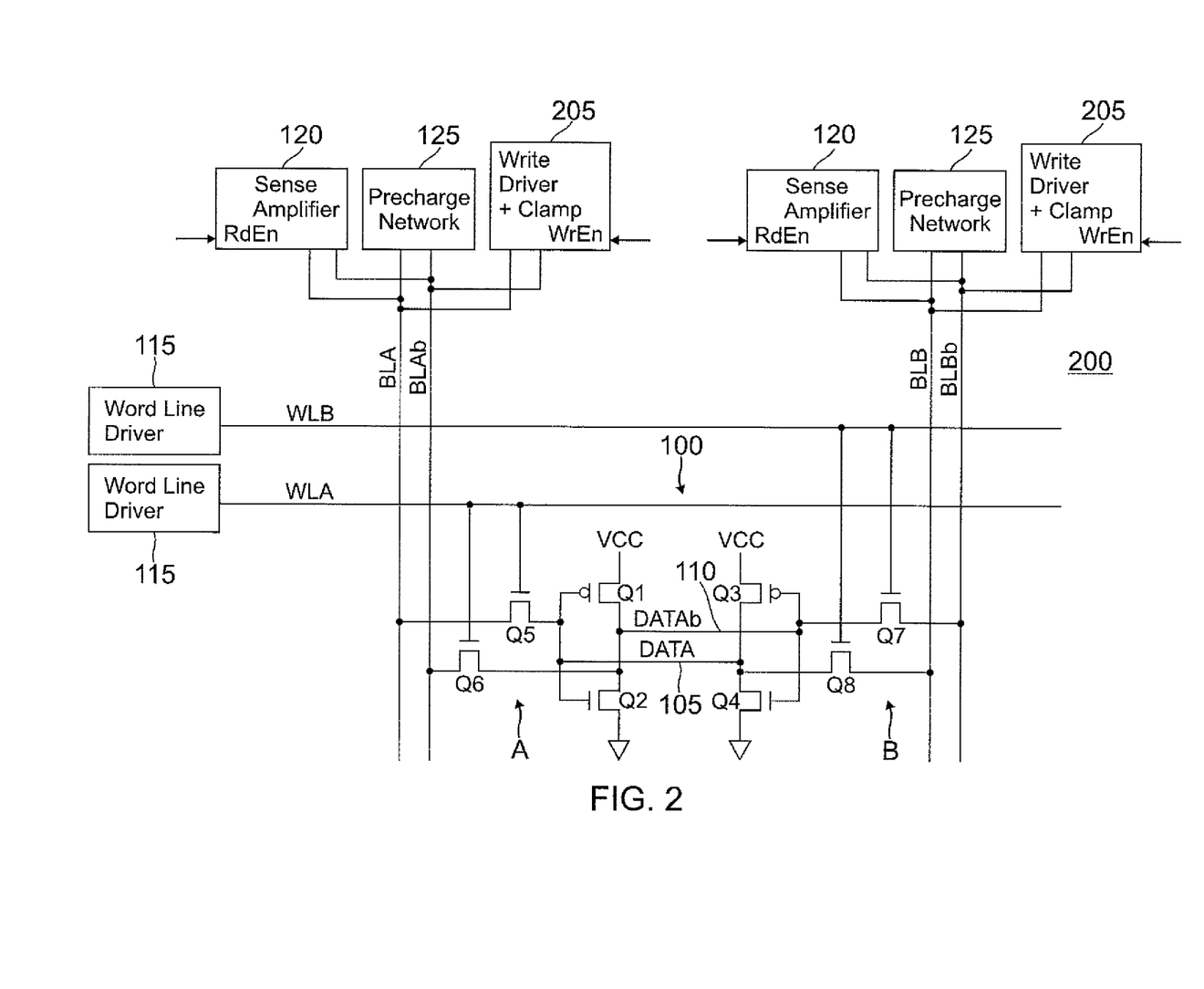
FIG. 2 is a schematic illustration of a dual-port SRAM configured for bit line clamping except during write operations.

FIG. 2 illustrates an example dual-port memory 200 that includes dual-port memory cell 100 that functions as discussed above with regard to FIG. 1. Thus, no modifications are necessary for memory cell 100, which avoids the die area increases and undesirable capacitive loading issues of the conventional approaches that require more robust memory cell transistors. The circuit topology is identical to that discussed with regard to FIG. 1 but the addition of bit-line clamping circuitry. One embodiment of the bit line clamping circuitry is a set of bit-line clamping write drivers 205 shown in FIG. 2.

Figure 3:
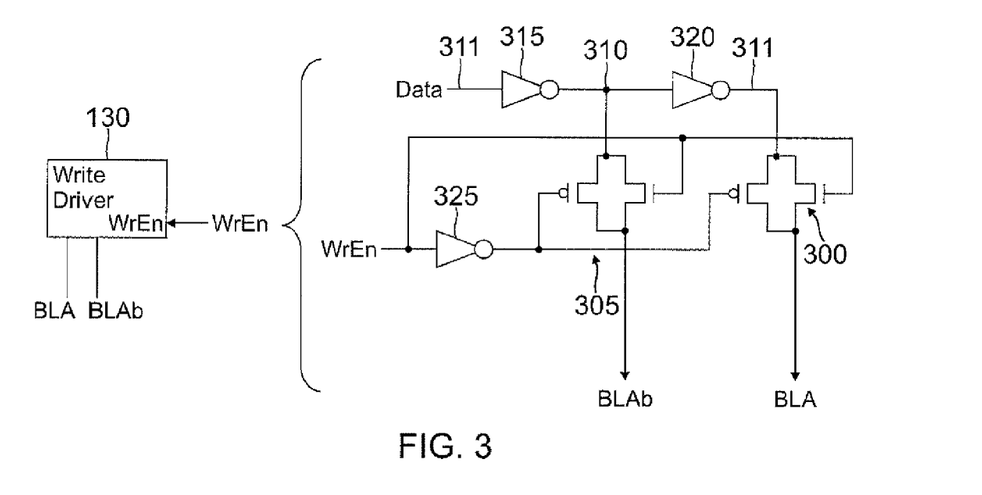
FIG. 3 is a schematic illustration of the write driver of FIG. 1.

FIG. 3 illustrates conventional write driver 130 of FIG. 1 for port A. Bit line A (BLA) couples to a first transmission gate 300 whereas bit line A complement (BLAb) couples to a second transmission gate 305. Second transmission gate 305 is driven by a data complement signal 310 resulting from an inversion of a data signal 311 at an inverter 315. Data complement signal 310 is re-inverted back into data signal 311 through a second inverter 320 so as to drive bit line BLA through first transmission gate 300. Both transmission gates are actuated on or off by a write enable signal (WrEn). When transmission gates 300 and 305 are conducting, bit line A will thus be driven by the data signal whereas bit line A complement will be driven by the data complement signal.

Figure 4:
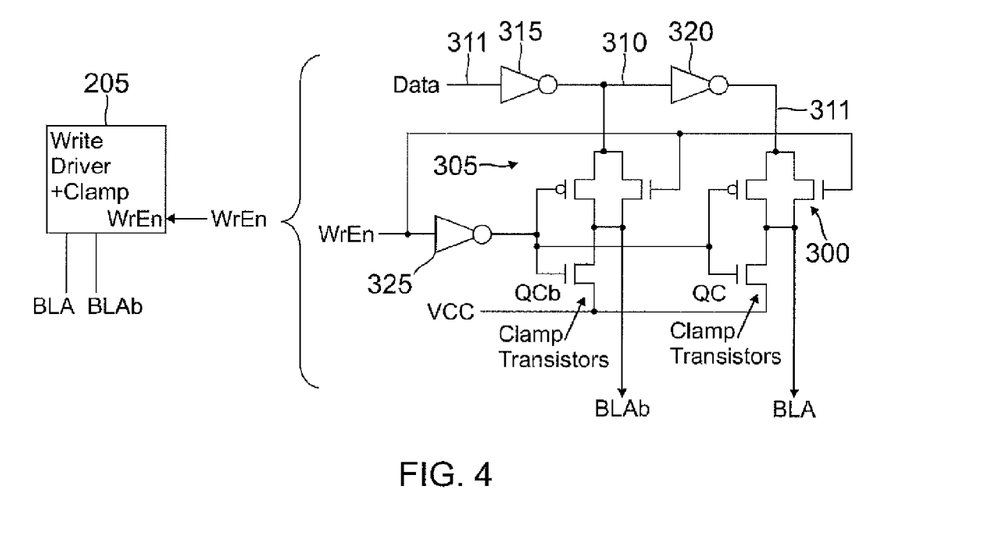
FIG. 4 is a schematic illustration of the bit-line-clamping write driver of FIG. 2.

FIG. 4 illustrates bit-line-clamping write driver 205 for port A. Write driver 205 includes all the components discussed above with regard to write driver 130. However, each bit line couples to a power supply voltage VCC through actuation of a corresponding clamping transistor. Bit line A couples to VCC through a clamping transistor QC whereas bit line A complement couples to VCC through a clamping transistor QCb. The clamping transistors have their gates driven by a complemented version of the write enable signal WrEn as produced by an inverter 325. This inverter is also included in write driver 130 to drive the PMOS side of the transmission gates. Thus, when the write enable signal is de-asserted (indicating no active write operation), the clamping transistors turn on and clamp the bit lines to the power supply voltage VCC minus the clamping transistor threshold voltage ($V_t$). This is quite advantageous in that the resulting dual-port memory 200 of FIG. 2 no longer needs to fight discharged bit lines when a write operation is active at one port and a read operation is active at the opposing port. For example, suppose a read operation is still active at port A in memory 200 such that complement bit line A (BLAb) is pulled low through transistor Q2 in that DATA node 105 is storing a logic high value. A write operation at port B that is flipping the state of memory cell 100 thus no longer needs to charge up BLAb through transistor Q6 since BLAb will not be pulled below the clamped voltage VCC-$V_t$. In this fashion, write operations may be completed more expeditiously.

Figure 5:
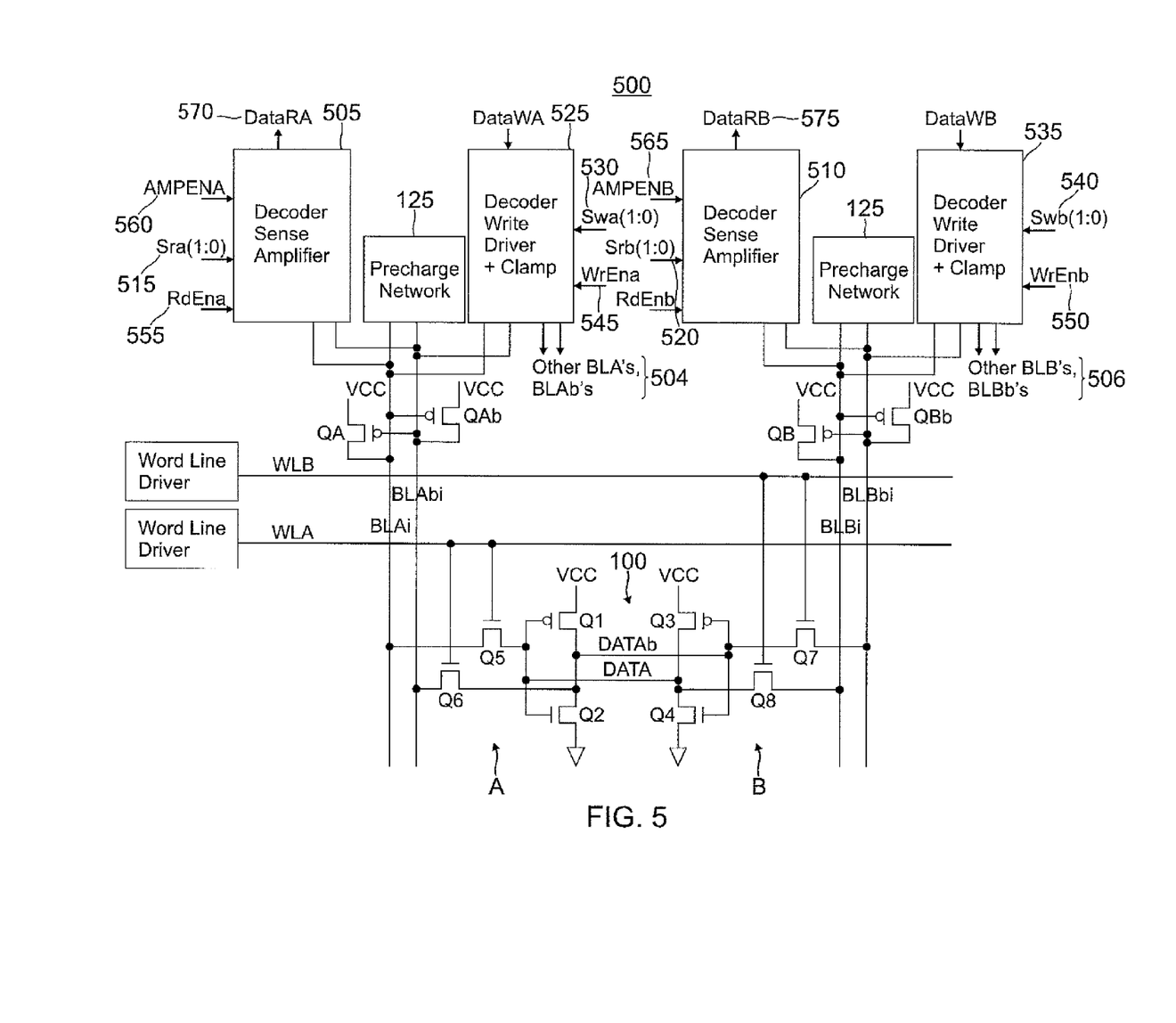
FIG. 5 is a schematic illustration of a dual-port SRAM with bit line clamping and with multiplexed bit lines.

The bit line clamping discussed herein is readily applied to memories in which bit line pairs are multiplexed at the sense amplifier. Such multiplexing is common so that multiple pairs of bit lines may be selectively sensed by a common sense amplifier. In this fashion, a single sense amplifier can service multiple pairs of bit lines, thereby reducing density. Bit line clamping in accordance with the present disclosure for multiplexed sense amplifiers may be better understood with reference to FIGS. 5, 6, and 7. FIG. 5 illustrates a bit-line-clamped dual port SRAM 500 with bit line multiplexing with regard to both the sense amplifiers and the write drivers. A memory cell 100 includes dual ports A and B as discussed earlier. A sense amplifier 505 senses the bit lines coupling to port A whereas a sense amplifier 510 senses the bit lines coupling to port B. For illustration clarity, only a selected pair of true and complement bit lines is shown coupling to port A and B, respectively. Because of the multiplexing, other bit line pairs corresponding to other dual port memory cells can be selected for sensing or writing as represented by bit lines 504 for port A and bit lines 506 for port B.

Through the bit line pair selection, an ith pair of bit lines couples to port A as a true bit line BLAi and a complement bit line BLAbi. Similarly, a true bit line BLBi and a complement bit line BLBbi couples to port B. Each sense amplifier includes decoding logic to select the appropriate pair of bit lines. For example, if a 4:1 multiplexing is used, each sense amplifier would decode a two bit address signal to select for a bit line pair from the possible four bit line pairs. Thus, sense amplifier 505 receives a two-bit address signal Sra(1:0) 515 whereas sense amplifier 510 receives a two-bit address signal Srb(1:0) 520.

Pairs of bit lines may also be multiplexed with regard to the write drivers in an analogous fashion. Thus, a port A write driver 525 receives a two-bit address signal Swa(1:0) 530 whereas a port B write driver 535 receives a two-bit address signal Swb(1:0) 540. Write driver 525 decodes its address signal responsive to a port A write enable signal WrEna 545. Similarly, write driver 535 decodes its address signal responsive to a port B write enable signal WrEnb 550. A precharge network 125 operates as discussed previously to pre-charge the bit lines prior to read and write operations. To assist the read operation accuracy, each bit line pair may be driven by a cross-coupled pair of PMOS transistors. For example, at port A, a drain of a PMOS transistor QA couples to true bit line BLAi. Similarly, a drain of a PMOS transistor QAb couples to complement bit line BLAbi. The gates of transistors QA and QAb are driven by the opposing bit line. The sources of transistors QA and QAb couples to a power supply voltage VCC node. Thus, if one bit line is driven lower in voltage than the opposing bit line, the cross-coupled nature of transistors QA and QAb will tend to drive the opposing bit line to VCC. This is advantageous in that the access transistors Q5 and Q6 can at best pass VCC minus their threshold voltage. In this fashion, if a read operation pulls, for example, bit line BLAbi down to the clamped voltage, bit line BLAi will remain pinned "full rail" to the power supply voltage VCC even though access transistor Q5 is not pulling bit line BLAi to VCC. In this fashion, the read operation will more successfully interpret the memory cell bit state. A pair of cross-coupled PMOS transistors QB and QBb operates analogously for bit lines BLBi and BLBbi.

Figure 6:
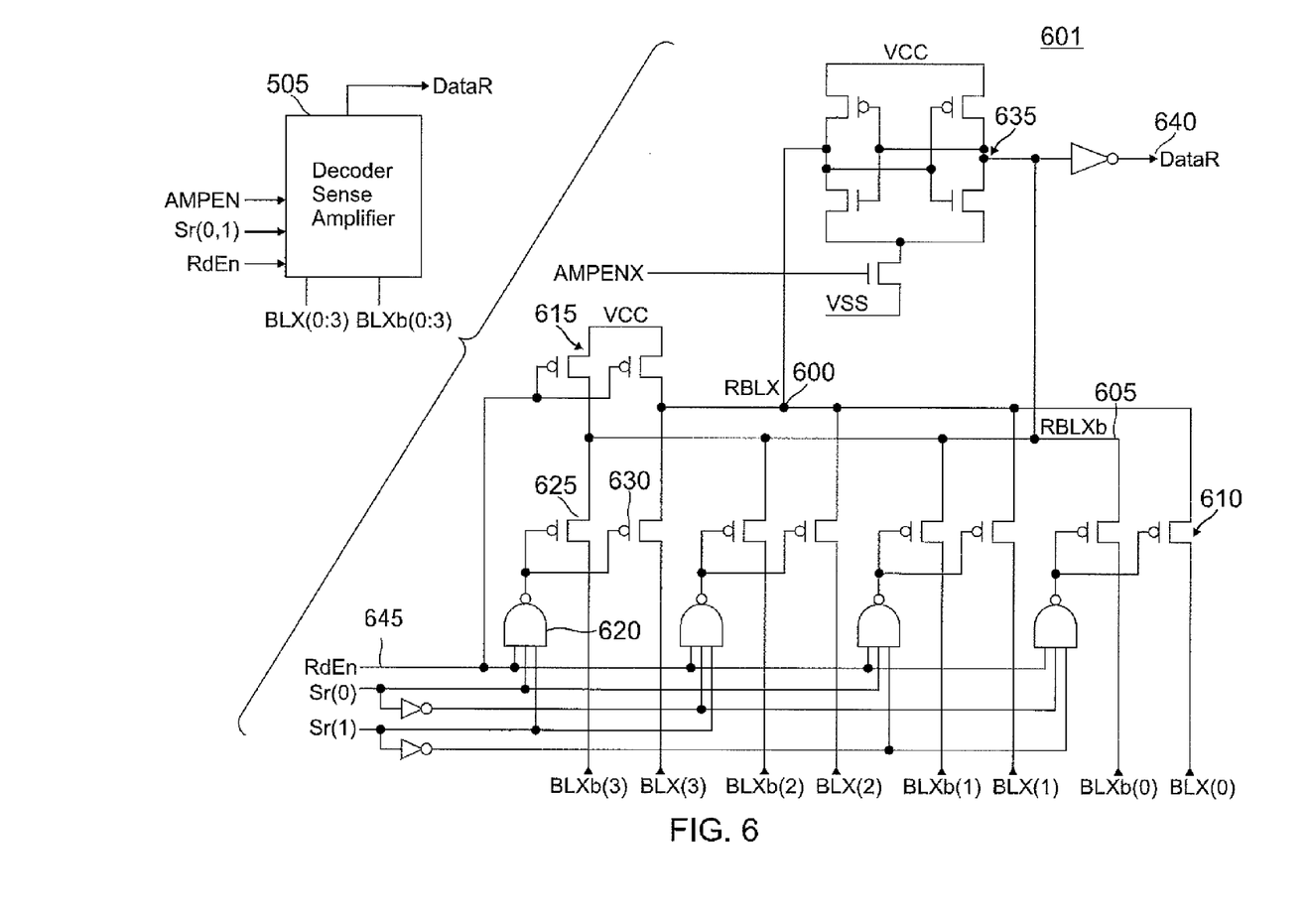
FIG. 6 is a schematic illustration of a sense amplifier for the memory of FIG. 5

FIG. 6 provides a more detailed circuit diagram for either sense amplifier 505 or 510 as represented by a sense amplifier 601. Sense amplifier 601 makes a bit decision by comparing the voltage of two internal read nodes: a true node RBLX 600 and a complement node RBLXb 605. The letter "X" in this designation may represent either port A or port B. True node 600 couples to a selected true bit line whereas complement node 605 couples to a selected complement bit line through action of a p-channel multiplexer 610. Nodes 600 and 605 are pre-charged to VCC through actuation of corresponding transistors 615 when a read enable signal 645 is low. The decoding logic comprises a set of NAND gates. For example, if read enable signal 645 and address signals Sra(0) and Sra(1) are all true, than a NAND gate 620 will turn on PMOS transistors 625 and 630. In this fashion, true node 600 is coupled to bit BLX (3) whereas complement node 605 is coupled to complement bit line BLXb(3). Even though the bit lines are clamped as discussed further with regard to FIG. 7, the resistance provided by PMOS multiplexer 610 enables a robust voltage difference to be developed across internal nodes 600 and 605. This voltage difference is driven by a positive feedback developed by cross-coupled transistor 635 that are actuated by enable signal AMPENX. Referring back to FIG. 5, sense amplifier 505 is thus enabled by an AMPENA signal 560 whereas sense amplifier 510 is enabled by an AMPENB signal 565. Positive feedback in cross-coupled transistors 635 will drive one of the internal read nodes high and one low depending upon the corresponding memory bit being read. The resulting bit decision is produced as a data signal DataR 640. Referring back to FIG. 5, sense amplifier 505 thus drives a port A data signal DataRA 570 whereas sense amplifier 510 drives a port B data signal DataRB 575.

Figure 7:
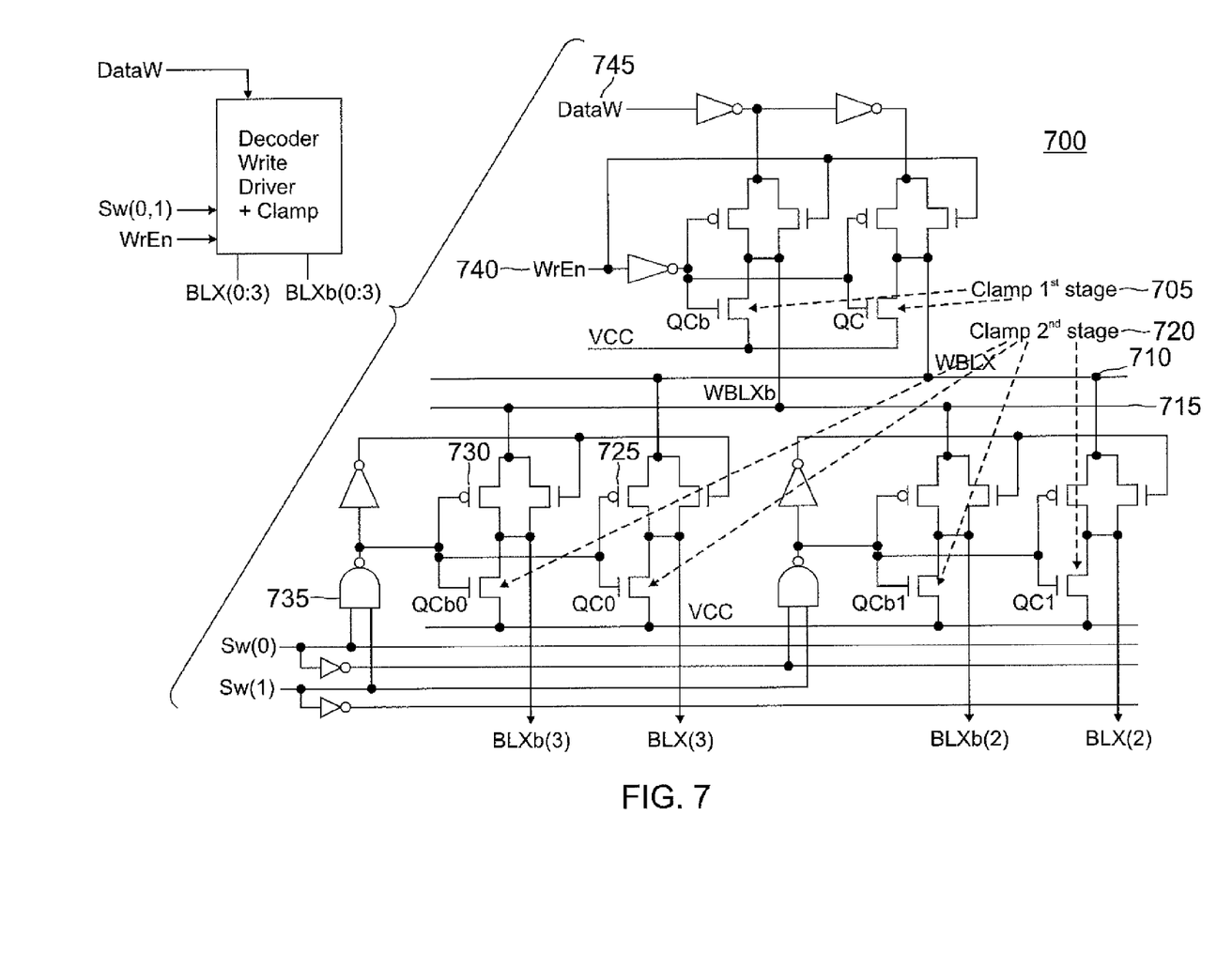
FIG. 7 is a schematic illustration of a write driver for the memory of FIG. 5.

The clamping of the multiplexed bit lines is further illustrated with reference to FIG. 7, which illustrates a generic write driver 700 that represents either of port A write driver 525 and port B write driver 535 of FIG. 5. The bit line clamping occurs through two stages of bit line clamping transistors to better accommodate the bit line multiplexing. A first clamping stage 705 operates as already discussed with regard to FIG. 4. However, rather than clamp the bit lines directly, clamping transistor QC and QCb clamp internal nodes. Clamping transistor QC thus drives an internal true node WBLX 710 whereas clamping transistor QCb drives an internal complement node WBLXb 715. As discussed above with regard to FIG. 6, the letter "X" is used in a generic sense to designate either letter A for port A or letter B for port B. For illustration clarity, just two sets of bit lines are shown in FIG. 7, a bit line pair of BLX(3) and BLXb(3) and also a bit line pair of BLX(2) and BLXb(2).

A clamp second stage 720 includes a set of transmission gates corresponding to the pairs of bit lines being multiplexed. For example, bit line BLX(3) couples to internal true node WBLX 710 through a transmission gate 725. Similarly, bit line BLXb(3) couples to internal complement node WBLXb 715 through a transmission gate 730. A pair of transmission gates thus corresponds to each selectable pair of bit lines. The transmission gates are selected through decoding logic. For example, each transmission gate pair may be driven or actuated through operation of a corresponding NAND gate. In clamp second stage 720, transmission gates 730 and 725 are driven by a NAND gate 735. NAND gate 735 receives write address bits Sw(0) and Sw(1). Thus, if both address bits are true, NAND gate 735 will turn on transmission gates 725 and 730. In turn, if a write enable signal (WrEn) signal 740 is true, bit line BLX(3) will be driven by a write data signal DataW 745 through node 710. Similarly, bit line BLXb(3) will be driven by write data signal DataW 745 through node 715.

Clamp second stage 720 includes a clamping transistor pair for each bit line pair. These second stage clamping transistors are turned off when the corresponding bit line pair is selected. For example, NAND gate 735 drives a gate for NMOS clamping transistors QCb0 and Qc0. Thus, if write address bits Sw(0) and Sw(1) are true, clamping transistors Qcb0 and Qc0 will be turned off. Otherwise, clamping transistors Qcb0 and Qc0 will clamp bit lines BLXb(3) and BLX(3) to VCC minus their threshold voltage. In this fashion, the decoding logic such as provided by NAND gate 735 keeps all unselected bit lines clamped and only unclamps the selected bit line pair that is being coupled to internal nodes WBLX and WBLXb. Because one of the NAND gates will be selected by any given state of the address bits, clamp first stage 705 prevents any undesired unclamping of bit lines when a write operation is inoperative.

It will be appreciated that the dual-port memory disclosed herein can advantageously provide faster write operations for a wide variety of applications. For example, the dual-port memory may be embedded in a programmable logic device such as a field programmable gate array. In that regard, the above-described embodiments of the present invention are representative of many possible embodiments. It will thus be apparent to those skilled in the art that various changes and modifications may be made to what has been disclosed without departing from this invention. The appended claims encompass all such changes and modifications as fall within the true spirit and scope of this invention.

We claim:

1. A memory, comprising:
    a write driver for selectively driving a driven pair of bit lines selected from a plurality of bit line pairs during a write operation;
    a first stage clamping circuit operable to clamp a pair of internal nodes to a clamping voltage, wherein the first stage clamping circuit is further operable to unclamp the pair of internal nodes during the write operation;
    a bit line multiplexer for selectively coupling the driven bit line pair to the pair of internal nodes; and
    a second stage clamping circuit operable to clamp the plurality of bit line pairs to the clamping voltage, wherein the second stage clamping circuit is further operable to unclamp the driven bit line pair during the write operation.

2. The memory of claim 1, further comprising:
    a dual port memory cell having a first port and a second port
    a first pair of access transistors; and
    a first word line for driving the first pair of access transistors, wherein the driven pair of bit lines couples to either the first port or the second port through the first pair of access transistors as driven by the first word line.

3. The memory of claim 1, wherein the second stage clamping circuit includes a plurality of second stage clamping transistors corresponding to the bit line pairs, and wherein each second stage clamping transistor is operable to clamp its corresponding bit line to a power supply voltage minus a threshold voltage for the clamping transistor.

4. The memory of claim 1, wherein the bit line multiplexer includes a pair of transmission gates for driving the driven bit line pair with a true and complement version of a data signal.

5. The memory of claim 1, wherein the memory is a dual-port SRAM.

6. The memory of claim 1, wherein the memory is embedded in a programmable logic device.

7. The memory of claim 6, wherein the programmable logic device is a field programmable gate array.

8. The memory of claim 2, further comprising a multiplexed sense amplifier for sensing a stored bit in the memory cell through a read operation through one of the bit line pairs.

9. A method of clamping a dual-port memory having a plurality of bit line pairs, comprising:
    clamping a pair of internal nodes to a clamping voltage;
    clamping the plurality of bit line pairs to the clamping voltage;
    during a write operation, unclamping the pair of internal nodes from the clamping voltage and unclamping a selected pair of bit lines from the plurality of bit line pairs;
    coupling the selected pair of bit lines to the pair of internal nodes; and
    driving the selected pair of bit lines with a write driver during the write operation.

10. The method of claim 9, further comprising:
    selecting a second pair of bit lines from the plurality of bit lines pairs;
    sensing a bit decision from a selected second pair of the bit lines corresponding to a read operation, wherein the read operation overlaps with the write operation at opposing ports of a dual-port memory cell within the dual-port memory.

11. The method of claim 10, wherein the bit line pairs and the pair of internal nodes are clamped using two stages of clamping circuitry.

12. The method of claim 10, wherein the sensing of the bit decision occurs through a p-channel multiplexer.

13. The method of claim 10, wherein the clamping voltage equals a supply voltage minus a transistor threshold voltage.

14. The method of claim 10, wherein the unclamping occurs according to a decoding of write address bits.

15. The method of claim 10, wherein the selection of the second bit line pair occurs responsive to a decoding of read address bits.

16. A dual-port memory, comprising:
    a plurality of bit line pairs;
    a multiplexer for coupling a driven one of the bit line pairs to a pair of internal nodes;
    bit line clamping circuitry operable to clamp the bit line pairs and the pair of internal nodes to a clamping voltage, wherein the bit line clamping circuitry is further operable to unclamp the driven bit line pair and the pair of internal nodes during a write operation for a dual-port memory cell; and
    a write driver for driving the driven bit line pair during the write operation.

17. The dual-port memory of claim 16, further comprising:
    a sense amplifier for sensing a selected second one of the bit line pairs during a read operation for the dual-port memory cell, wherein the bit line clamping circuitry clamps the second one of the bit line pairs to the clamping voltage during the read operation.

18. The dual-port memory of claim 17, further comprising: a word line coupling to a pair of access transistors, wherein the sense amplifier senses the selected second one of the bit lines through the pair of access transistors as driven by the word line, and wherein dual-port memory cell drives one of the bit lines in the selected second one of the bit lines with a supply voltage minus a threshold voltage for the access transistors.

19. The dual-port memory of claim 17, wherein the sense amplifier senses the selected one of the bit line pairs through a p-channel multiplexer.

20. The dual-port memory of claim 16, wherein the dual-port memory is a dual-port SRAM.

* * * * *